(12) United States Patent
Lee

(10) Patent No.: US 6,628,134 B1
(45) Date of Patent: Sep. 30, 2003

(54) DC STRESS SUPPLY CIRCUIT

(75) Inventor: Chang Yeol Lee, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 60 days.

(21) Appl. No.: 09/606,476

(22) Filed: Jun. 29, 2000

(30) Foreign Application Priority Data

Jun. 30, 1999 (KR) ......................................... 1999-25647

(51) Int. Cl.[7] ............................................. G01R 31/02
(52) U.S. Cl. ....................................... 324/763; 324/765
(58) Field of Search ................................. 324/763, 765, 324/768, 769, 158.1, 771; 714/718, 719; 365/102, 185.17, 189.04, 230.01

(56) References Cited

U.S. PATENT DOCUMENTS

| | | | |
|---|---|---|---|
| 4,855,888 A | | 8/1989 | Henze et al. |
| 5,065,073 A | | 11/1991 | Frus |
| 5,404,099 A | * | 4/1995 | Sahara .................... 324/158.1 |
| 5,880,540 A | * | 3/1999 | Bessho et al. .............. 307/131 |
| 5,973,981 A | * | 10/1999 | Lee ....................... 365/230.01 |
| 6,181,145 B1 | * | 1/2001 | Tomita et al. .............. 324/754 |
| 6,236,225 B1 | * | 5/2001 | Bertotti et al. ............. 324/769 |

FOREIGN PATENT DOCUMENTS

| | | |
|---|---|---|
| JP | 63228084 | 9/1988 |
| JP | 63253270 | 10/1988 |
| JP | 05275645 | 10/1993 |
| JP | 06105456 | 4/1994 |
| JP | 07319341 | 12/1995 |

* cited by examiner

*Primary Examiner*—Kamand Cuneo
*Assistant Examiner*—Minh N. Tang
(74) *Attorney, Agent, or Firm*—Pillsbury Winthrop LLP

(57) ABSTRACT

A DC stress supply circuit for a semiconductor circuit having a plurality of DC stress supply terminals and a plurality of switches in which the DC stress terminals are connected to some nodes of the unit elements included in the semiconductor circuit, respectively. The switches allow a DC stress to be applied selectively, to the nodes from the DC stress terminals according to a control signal.

3 Claims, 6 Drawing Sheets

DC STRESS SUPPLY CIRCUIT

FIELD OF THE INVENTION

This invention relates to a DC (direct current) stress supply circuit, and more particularly to a DC stress supply circuit for directly measuring an amount that a speed delay per an unit gate measured from a ring oscillator is varied by the degradation of an unit element owing to hot carriers.

DESCRIPTION OF THE RELATED ART

In general, In semiconductor memory devices such as dynamic random access memories (DRAMs) or static random access memories (SRAMs), the hot carriers degrade the property of the device to reduce the operation speed of the semiconductor memory device. It should analyze the degradation due to hot carriers in manufacturing the semiconductor memory device.

The property degradation of the device due to hot carriers is very insignificant in a normal voltage condition. Conventionally, because the ratio of degradation due to hot carriers is several percents during ten years, the degradation of the device is measured by supplying the stress voltage higher than the normal voltage to the device where the degradation is to be measured. The measurement method is called as an acceleration test.

However, the acceleration test is hardly possible to measure the degradation of the unit element by supplying different conditions to each of the unit elements in a circuit level which is comprised of the unit elements. It is because in the respective unit element constituting the circuit, for example a transistor, the drain voltage and the gate voltage are not arbitrarily adjustable and because it is impossible to supply a certain hot carrier stress to the respective unit element. Therefore, in the prior, the indirect method that supplies the stress voltage to the circuit level by the hot carrier acceleration measurement method once and draws model parameters of the respective unit elements and then analyzes the device degradation through computer simulation using the model parameters, is utilized.

However, because the computer simulation method using the model parameters is not a direct analysis method but an indirect analysis method to device degradation in the circuit level, the error between the experimental data and the substantial data is large and it takes a long time to test the individual elements.

SUMMARY OF THE INVENTION

It is an object of the present invention to provide a DC stress supply circuit which includes terminals for supplying stress from the exterior and a switch for selecting an operation mode and directly measures the whole degradation of the operation speed of a circuit by directly supplying hot carriers to elements constituting the circuit.

According to an aspect of the present invention, there is provided to DC stress supply circuit in a semiconductor circuit having unit elements, comprising: a plurality of DC stress supply means for providing DC stress signals to the unit elements of the semiconductor circuit; and a plurality of switching means for controlling the DC stress signals from the DC stress supply means to be provided to the unit elements in accordance with control signals.

In the DC stress supply circuit, the plurality of the DC stress supply means provide the DC stress signals to the unit elements, respectively. The plurality of DC stress supply means are commonly connected to a common terminal, thereby providing one of the DC stress signals to all the unit elements of the semiconductor circuit. Of the plurality of DC stress supply means, even means are commonly connected to an even common terminal and odd means are commonly connected to an odd common terminal, respectively.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1:
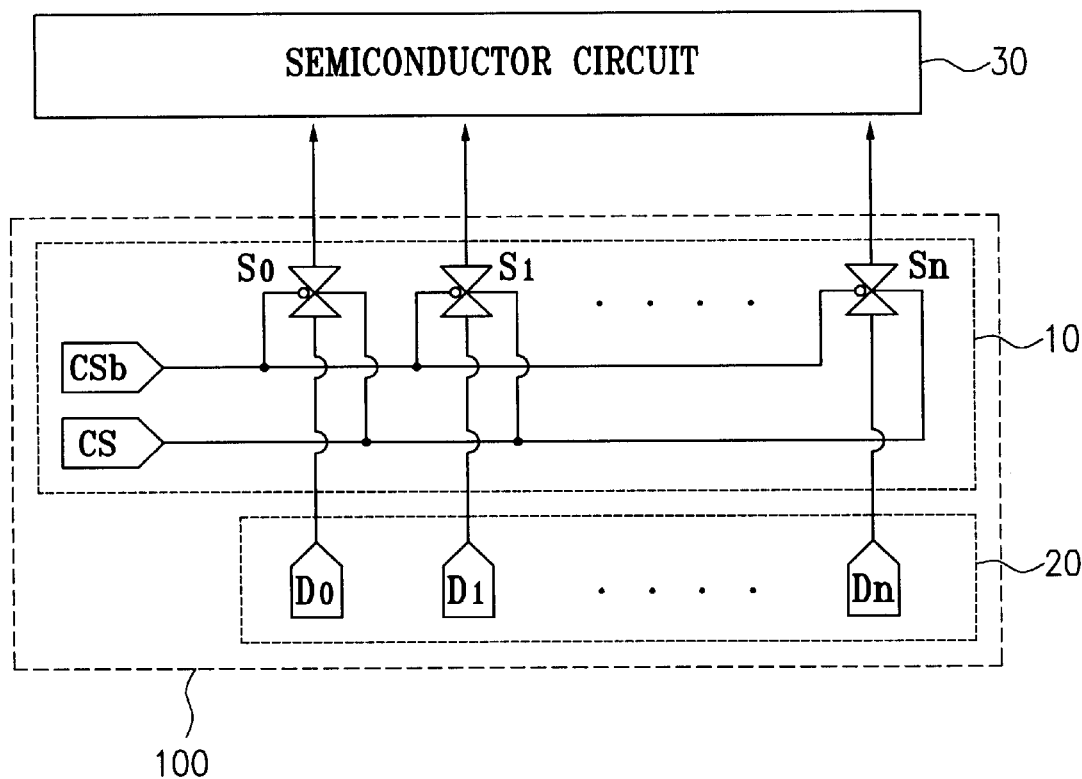
FIG. 1 is a diagram illustrating a DC stress supply circuit and a semiconductor circuit using the DC stress supply circuit of the present invention.

FIG. 1 shows a DC stress supply circuit and a semiconductor circuit using the DC stress supply circuit of the present invention. Referring to FIG. 1, the DC stress supply circuit 100 includes a supply part for directly supplying DC stress signals D0–Dn to elements (not shown) inside a semiconductor circuit 30 and a switching part 10 for controlling the DC stress signals D0–Dn from the DC stress supply part 20 to be supplied to the semiconductor circuit 30 by control signals CS and CSb.

The DC stress supply part 20 includes a plurality of terminals for supplying the DC stress signals D0–Dn to the element inside the semiconductor circuit 30, respectively. The switching part 10 includes a plurality of CMOS switches S0–Sn for being switched by the control signals CS and CSb. If the control signal CS is high state and the control signal CSb is low state, the CMOS switches S0–Sn are turned on. The DC stress signals D0–Dn from the DC stress supply terminals are provided to the elements of the semiconductor circuit 30 through the CMOS switches S0–Sn, respectively. If the control signal CS is low state and the control signal CSb is high state, the CMOS switches S0–Sn are turned off. The DC stress signals D0–Dn from DC stress supply terminals are not provided to the elements of the semiconductor circuit 30 by the CMOS switches S0–Sn.

Figure 2A:
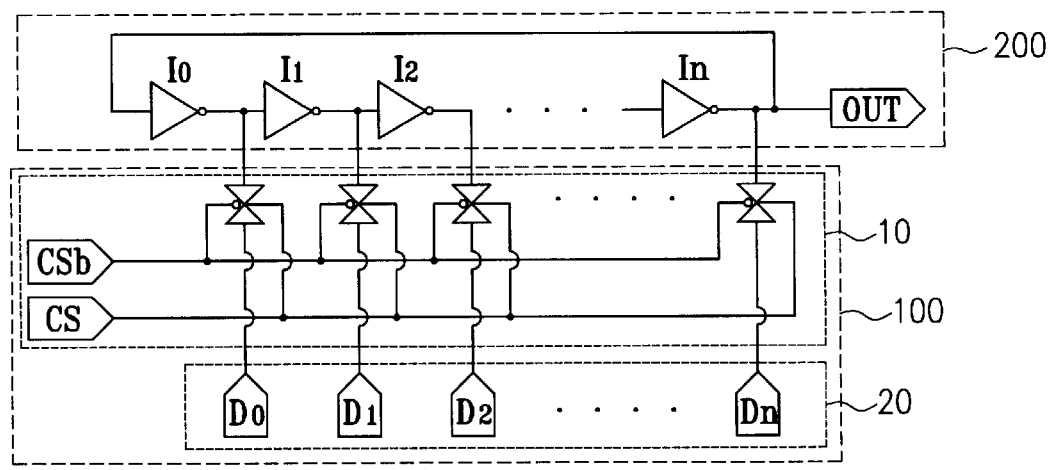
FIG. 2A is a diagram illustrating a circuit that the DC stress supply circuit is coupled to a ring oscillator.
Figure 2B:
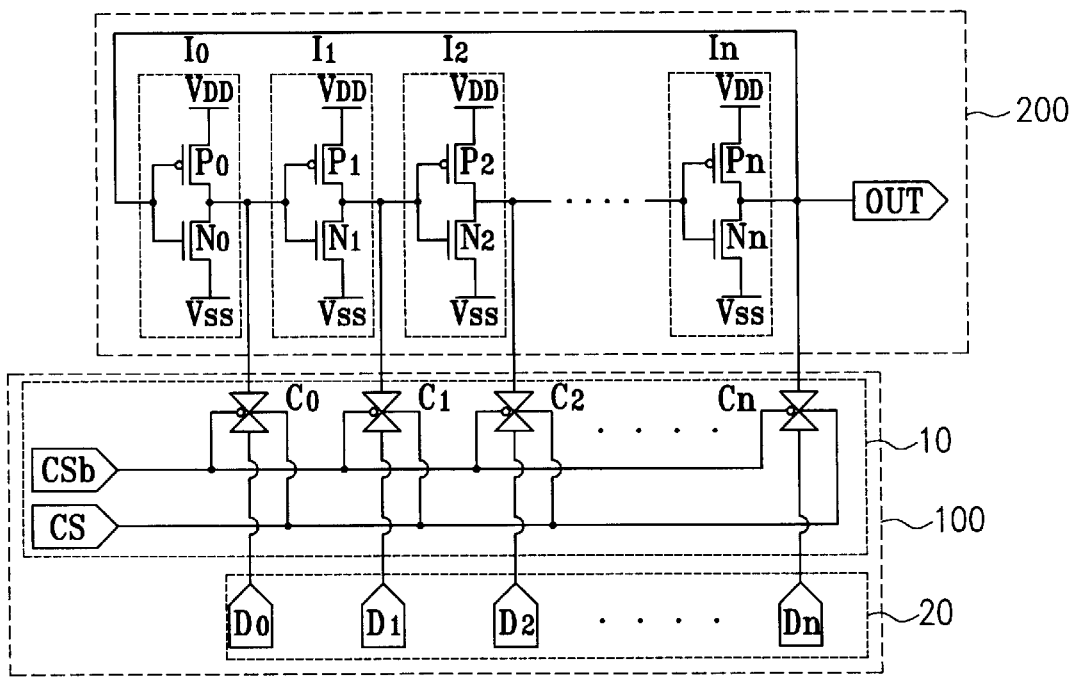
FIG. 2B is a detained circuit diagram of FIG. 2A.

FIG. 2A shows a circuit that the DC stress supply circuit is coupled to a ring oscillator and FIG. 2B is a detailed circuit diagram of FIG. 2A. Referring to FIG. 2A, the ring oscillator 200 includes a plurality of inverters I0–In connected in series. Of inverters I0–In, an output of the final inverter In is fed back to an input of the first inverter I0. The DC stress supply circuit 100 includes a DC stress supply part 20 which provides DC stress signals D0–Dn to the ring oscillator 200 and a switching part 10 for controlling the DC stress signals D0–Dn to be provided to input terminals of the inverters I0–In in the ring oscillator 200.

FIG. 2B is a detained circuit of FIG. 2A. The inverters I0–In of the ring oscillator 200, each includes a PMOS transistor P0–Pn and a NMOS transistor N0–Nn connected in series. A drain of the PMOS transistor P0–Pn and a drain of the NMOS transistor N0–Nn are connected to each other and gates of the PMOS transistor P0–Pn and NMOS transistor N0–Nn are commonly connected to an output of the previous inverter. A power voltage is provided to source of the PMOS transistor P0–Pn and a ground voltage Vss is provided to source of the NOS transistor N0–Nn.

The DC stress supply circuit 100 provides the DC stress signals D0–Dn to the input terminals of the inverters I0–In, respectively. That is, the DC stress signal D0, D1, . . . are provided to the input terminals of the inverters I1, I2, . . . and the DC stress signal Dn is provided to the input terminal of the first inverter I0.

So as to measure the device degradation due to hot carriers and the delay of the operation speed due to gradation by using the DC stress supply circuit 100, it maintains the control signal CS to a low state and the control signal CSb to a high state and it turns off the CMOS switches S0–Sn and then operate the ring oscillators. The gate delay is obtained through the operation of the ring oscillator 200.

Thereafter, it makes the control signal CS to be in a high state and the control signal CSb to be in a low state to turn on the CMOS switches S0–Sn. The DC stress signals D0–Dn are provided to the input terminals of the inverters I0–In, thereby degrading the ring oscillator 200. At this time, in order to degrade the NMOS transistors N0–Nn of the inverters I0–In in the ring oscillator 200, the PMOS transistors P0–Pn are separated from the power voltage Vcc and only the ground voltage Vss is supplied to the NMOS transistors N0–Nn. On the other hand, in order to degrade the NMOS transistors N0–Nn, the NMOS transistors N0–Nn is separated from the ground voltage Vss and only the power supply is provided to the PMOS transistors P0–Pn.

After it makes the PMOS transistor P0–Pn, or the NMOS transistors N0–Nn or both the PMOS transistors P0–Pn and the NMOS transistors N0–Nn to degrade for a predetermined time, it makes the CMOS switches S0–Sn to turn off again and it provides the power voltage Vcc and the ground voltage Vss to the Inverters I0–In to operate the ring oscillator 200. Then, the gate delay is measured.

As above described, if it degrades the NMOS transistors N0–Nn or the PMOS transistors N0–Nn of the inverters I0–In in the ring oscillator 200 under the desired conditions, then it can obtain the gate delay under the desired conditions.

Because the gate delay of one inverter in the ring oscillator 200 as shown in FIG. 2A is very minute, it constitutes the ring oscillator 200 with several hundreds of inverter stages so as to set the operation frequency within the measurable range. Accordingly, in this case, if the DC stress signals are provided to internal terminals of the ring oscillators 200, because several hundreds of terminals for measurement and power supplies are required, it is impossible to actually embody the ring oscillator. Accordingly, it is necessary to limit the DC stress supply terminals to the measurable number.

Figure 3:
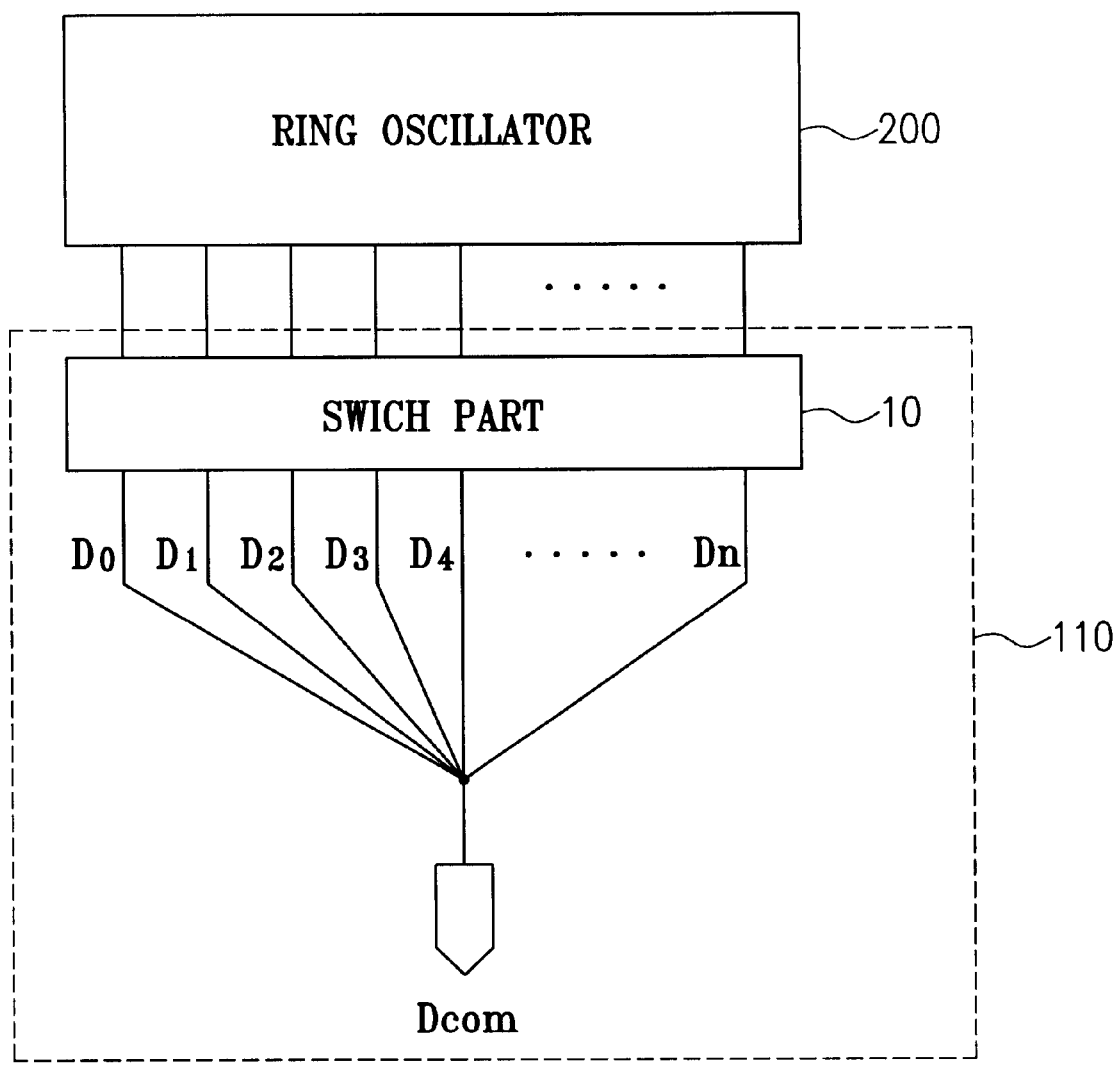
FIG. 3 is a circuit diagram of a DC stress supply circuit in accordance with another embodiment of the present invention.

FIG. 3 shows a DC stress supply circuit in accordance with another embodiment of the present invention. The DC stress circuit 110 provides the DC stress signals D0–Dn to the ring oscillator 200 through one common signal Dcom.

Referring to FIG. 3, because the plural DC stress supply terminals D0–Dn are commonly connected to one common terminal Dcom, when the DC stress signals D0–Dn are provided to the inverters I0–In of the ring oscillator 200, the equivalent stress is provided to the input terminals of the inverters I0–In, i.e. the gates of the PMOS transistors P0–Pn and the NMOS transistors N0–Nn. Accordingly, the DC stress supply circuit 110 of FIG. 3 is utilized in measuring the gate delay under the condition that the same conditions are provided to all elements of the semiconductor circuit.

Figure 4:
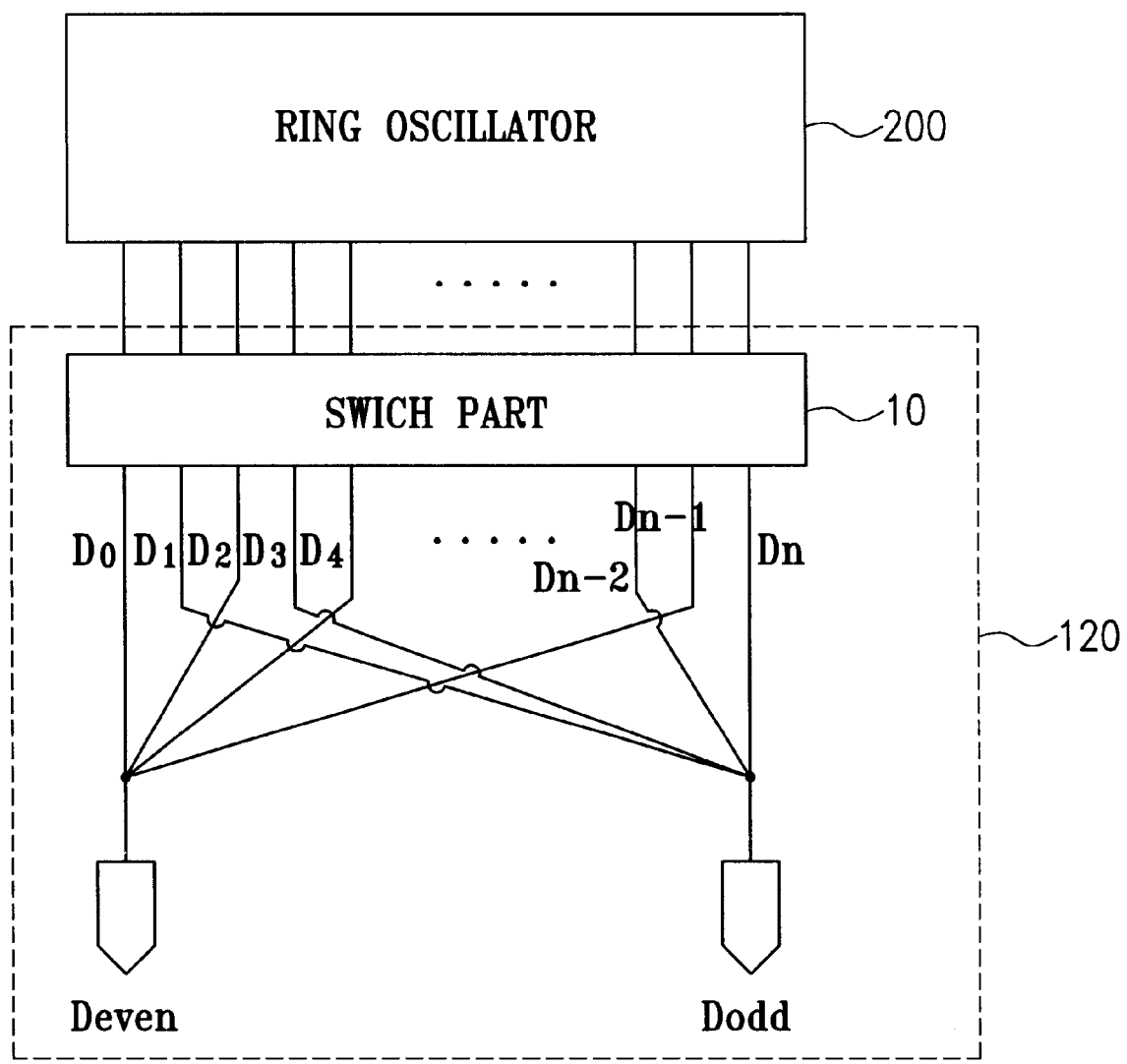
FIG. 4 is a circuit diagram of a DC stress supply circuit in accordance with further another embodiment of the present invention.

FIG. 4 shows a DC stress circuit in accordance with further embodiment of the present invention. The DC stress supply circuit 120 has a construction that of the Dc stress signals D0–Dn which are provided to the ring oscillator 200, the even stress signals D0, D2, . . . are coupled to an even common signal Deven and the odd stress signals D1, D3, . . . are coupled to an odd common signal Dodd.

Referring to FIG. 4, of the DC stress signals D0–Dn, the even DC stress signals D0, D2, . . . and the odd DC stress signals D1, D2, . . . are commonly coupled to the even common signals Deven and Dodd, respectively. Accordingly, it is possible to provide the DC stress signals having different values to the gates of the PMOS transistors P0–Pn and the NMOS transistors N0–Nn in the inverters I0–In. For example, after the even common signal Deven of the A voltage and the odd common signal Dodd of the B voltage are provided for a constant time, if the even common signal Dodd of the B value and the odd common signal Dodd of the A voltage are provided for the constant time, then the PMOS transistors P0, P2, . . . and the NMOS transistors N0, N2, . . . of the even inverters I0, I2, . . . receive the DC stress with the condition of A and B voltages and the PMOS transistors P1, P3, . . . and the NMOS transistors N1, N3, . . . of the odd inverters I1, I3, . . . receive the DC stress with the condition of B and A voltages. Accordingly, with the adjustment of the A and B voltages, it is possible to provide the different DC stresses to the gates of the PMOS transistors P0–Pn and the NMOS transistors N0–Nn.

Figure 5:
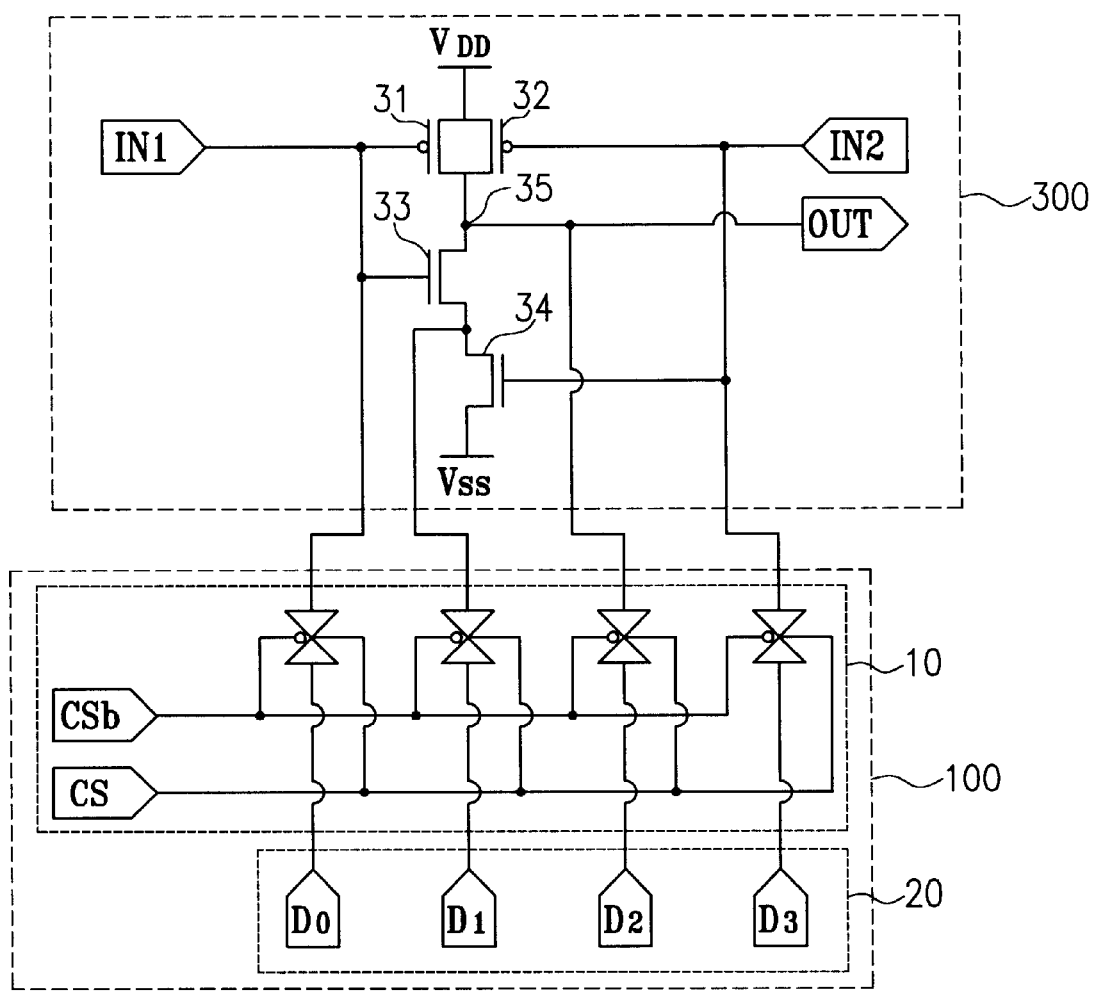
FIG. 5 is a circuit diagram that the DC stress supply circuit is coupled to a two-input NAND circuit.

FIG. 5 shows a circuit that the DC stress supply circuit is coupled to a two-input NAND circuit. In FIG. 5, the SC stress supply circuit 100 supplies the DC stress signals D0–D3 to the conventional two-input NAND circuit 300. Referring to FIG. 5, the conventional NAND circuit 300 has a construction as follows. PMOS transistors 31 and 32 are connected in parallel between a power supply VDD and a node 35 and NMOS transistors 33 and 34 are connected in series between the node 35 and a ground terminal Vss. A first input signal IN1 and a second input signal IN2 are provided to gates of the PMOS transistors 31 and 32, respectively and to gates of the NMOS transistors 33 and 34, respectively. An output signal OUT of the NAND circuit 300 is provided through drains of the PMOS transistors 31 and 32 and the NMOS transistor 33 commonly connected at the node 35.

In the conventional two-input NAND circuit 300, the DC stress signals D1 and D3 are provided to the input terminals IN1 and IN2, i.e. gates of the PMOS transistors 31 and 32 and the NMOS transistors 33 and 34, respectively. The DC stress signal D2 is provided to the output terminal OUT and the DC stress signal D1 is provided to a drain and a source of the NMOS transistors 33 and 34 commonly connected. Therefore, the DC stress signals having different voltages are provided to the terminals of the two-input NAND circuit 300, thereby measuring the gate delay due to device degradation.

Besides, the gate delay of the conventional NAND circuit due to the device degradation is measured under the different conditions by providing the DC stress signals to the DC stress signals D0–D4 which are commonly connected by the common terminal Dcom as shown in FIG. 3 or by providing the DC stress signals to the even DC stress supply terminals D0 and D2 commonly connected through the even common terminal Deven and to the odd stress supply terminals D1 and D3 commonly connected through the odd common terminal Dodd as shown in FIG. 4, instead of the DC stress supply circuit 100.

Figure 6:
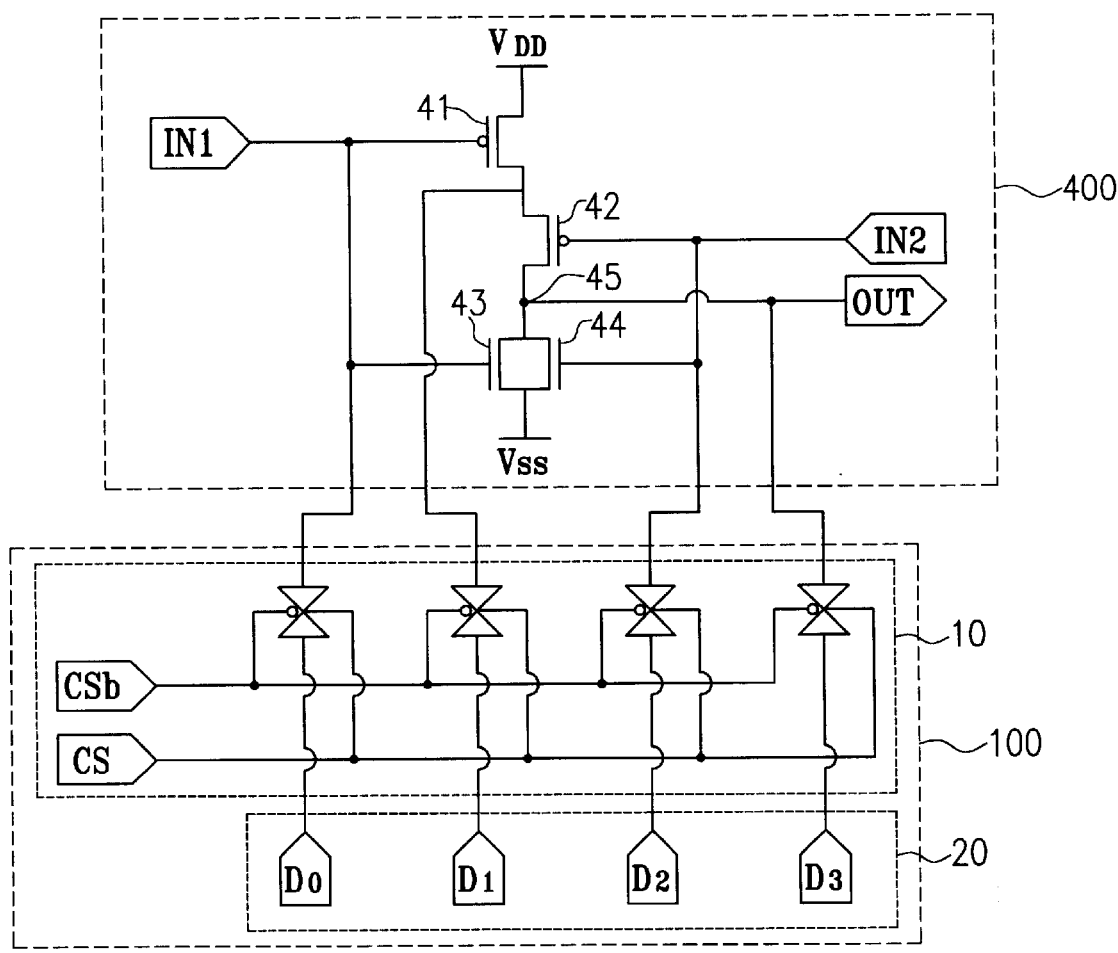
FIG. 6 is a circuit diagram that the DC stress supply circuit is coupled to a two-input NOR circuit.

FIG. 6 shows a circuit that the DC stress supply circuit 100 is coupled to a two-input NOR circuit. The DC stress supply circuit 100 provides the DC stress signals D0–D3 to the conventional NOR gate 400. Referring to FIG. 6, the conventional NOR gate has a construction as follows. PMOS transistors 41 and 42 are connected in series between a power supply Vdd and a node 45 and NMOS transistors 43 and 44 are connected in parallel between the node 45 and a ground terminal Vss.

A first input signal IN1 and a second input signal IN2 are provided to gates of the PMOS transistors 41 and 42, respectively and to gates of the NMOS transistors 43 and 44, respectively. An output signal OUT of the NOR circuit 400 is provided through drain of the PMOS transistor 42 and the NMOS transistors 43 and 44 commonly connected at the node 45.

In the conventional two-input NOR circuit 400, the DC stress signals D1 and D2 are provided to the input terminals IN1 and IN2, i.e. gates of the PMOS transistors 41 and 42 and the NMOS transistors 43 and 44, respectively. The DC stress signal D3 is provided to the output terminal OUT and the DC stress signal D1 is provided to a drain and a source of the PMOS transistors 41 and 42 commonly connected. Therefore, the DC stress signals having different voltages are provided to the terminals of the two-input NOR circuit 400, thereby measuring the gate delay due to device degradation.

Besides, the gate delay of the conventional NOR circuit due to the device degradation is measured under the different conditions by providing the DC stress signals to the DC stress signals D0–D4 which are commonly connected by the common terminal Dcom as shown in FIG. 3 or by providing the DC stress signals to the even DC stress supply terminals D0 and D2 commonly connected through the even common terminal Deven and to the odd stress supply terminals D1 and D3 commonly connected through the odd common terminal Dodd as shown in FIG. 4, instead of the DC stress supply circuit 100.

The DC stress supply circuit may be adapted to any logic circuits excepts the NAND circuit and the NOR circuit shown in FIG. 5 and FIG. 6 to directly measure the gate delay of the unit elements in the logic circuit due to the device degradation, thereby experimentally determining the life of the products.

According to the present invention, it experimentally determines the gate delay of the device degradation caused by hot carriers through the DC stress supply circuit. It can improve the reliability of the result using the direct measurement method as compared with the prior indirect measurement method using the computer simulation. Besides, it can establish the objective and ideal regulations to the life of the products using the gate delay of the unit element measured through the DC stress supply circuit and it can obtain the design guidelines of elements.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A stress supply circuit for applying stress signals to a plurality of nodes of a semiconductor circuit, comprising:

a plurality of terminals which are connected to the nodes of the semiconductor circuit when a stress test is accomplished for the semiconductor circuit; and a plurality of switches for selectively allowing the stress signals to be applied to the nodes from the terminals, according to a control signal, wherein each node of the semiconductor circuit is a gate, a drain, or a source of a transistor of the semiconductor circuit.

2. The stress supply circuit as claimed in claim 1, wherein all of the terminals are connected together.

3. The DC stress supply circuit as claimed in claim 1, wherein predetermined ones of the terminals are connected together.

* * * * *